United States Patent
Hu

(10) Patent No.: US 12,349,312 B2
(45) Date of Patent: Jul. 1, 2025

(54) RADIATOR AND GRAPHICS PROCESSING UNIT SERVICEABILITY COMPONENT

(71) Applicant: DELL PRODUCTS L.P., Round Rock, TX (US)

(72) Inventor: Shih Hsuan Hu, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 266 days.

(21) Appl. No.: 18/302,406

(22) Filed: Apr. 18, 2023

(65) Prior Publication Data

US 2024/0357766 A1 Oct. 24, 2024

(51) Int. Cl.
  *H05K 7/20* (2006.01)
  *F16F 15/08* (2006.01)
  *F16M 13/02* (2006.01)
  *G06F 1/20* (2006.01)

(52) U.S. Cl.
  CPC ......... *H05K 7/20272* (2013.01); *F16F 15/08* (2013.01); *F16M 13/02* (2013.01); *G06F 1/20* (2013.01); *H05K 7/20254* (2013.01)

(58) Field of Classification Search
  CPC combination set(s) only.
  See application file for complete search history.

(56) References Cited

U.S. PATENT DOCUMENTS

| | | | | |
|---|---|---|---|---|
| 8,405,975 | B2 * | 3/2013 | Helberg | G06F 1/203 |
| | | | | 361/679.55 |
| 9,448,602 | B2 * | 9/2016 | Franz | G06F 1/20 |
| 10,354,356 | B2 * | 7/2019 | Hu | G06F 15/163 |
| 10,684,661 | B1 * | 6/2020 | Thakar | G06F 1/20 |
| 11,119,543 | B2 * | 9/2021 | Thakar | H05K 7/20727 |
| 11,467,637 | B2 * | 10/2022 | Cheng | H05K 7/20509 |
| 11,937,399 | B2 * | 3/2024 | Zhang | H05K 7/20772 |
| 2002/0062648 | A1 * | 5/2002 | Ghoshal | F28D 15/0233 |
| | | | | 165/104.33 |
| 2020/0042053 | A1 * | 2/2020 | Cheng | H05K 7/20509 |
| 2020/0341524 | A1 * | 10/2020 | Thakar | H05K 7/20727 |
| 2022/0095482 | A1 * | 3/2022 | Helberg | G06F 1/206 |
| 2022/0334623 | A1 * | 10/2022 | Zuo | H05K 7/20772 |
| 2023/0422389 | A1 * | 12/2023 | Subrahmanyam | H05K 1/0203 |
| 2024/0114664 | A1 * | 4/2024 | Radke | H01L 23/473 |
| 2024/0357766 | A1 * | 10/2024 | Hu | H05K 7/20254 |

* cited by examiner

*Primary Examiner* — Lisa Lea-Edmonds
(74) *Attorney, Agent, or Firm* — Larson Newman, LLP

(57) ABSTRACT

A liquid cooling system for an information handling system includes multiple cold plates, multiple pumps, and a first support bracket. The multiple cold plates includes first, second, third, and fourth cold plates. The multiple pumps include first, second, third, and fourth pumps. The first pump is in physical communication with the first cold plate and the second pump is in physical communication with the second cold plate. The first support bracket is in physical communication with the first and second cold plates and with the first and second pumps. The first support bracket secures the first pump to the first cold plate and secures the second pump to the second cold plate.

20 Claims, 8 Drawing Sheets

RADIATOR AND GRAPHICS PROCESSING UNIT SERVICEABILITY COMPONENT

FIELD OF THE DISCLOSURE

The present disclosure generally relates to information handling systems, and more particularly relates to a radiator and graphics processing unit serviceability component.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs, and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A liquid cooling system for an information handling system includes multiple cold plates, multiple pumps, and a first support bracket. The multiple cold plates include first, second, third, and fourth cold plates. The multiple pumps include first, second, third, and fourth pumps. The first pump is in physical communication with the first cold plate and the second pump is in physical communication with the second cold plate. The first support bracket is in physical communication with the first and second cold plates and with the first and second pumps. The first support bracket may secure the first pump to the first cold plate and secure the second pump to the second cold plate.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
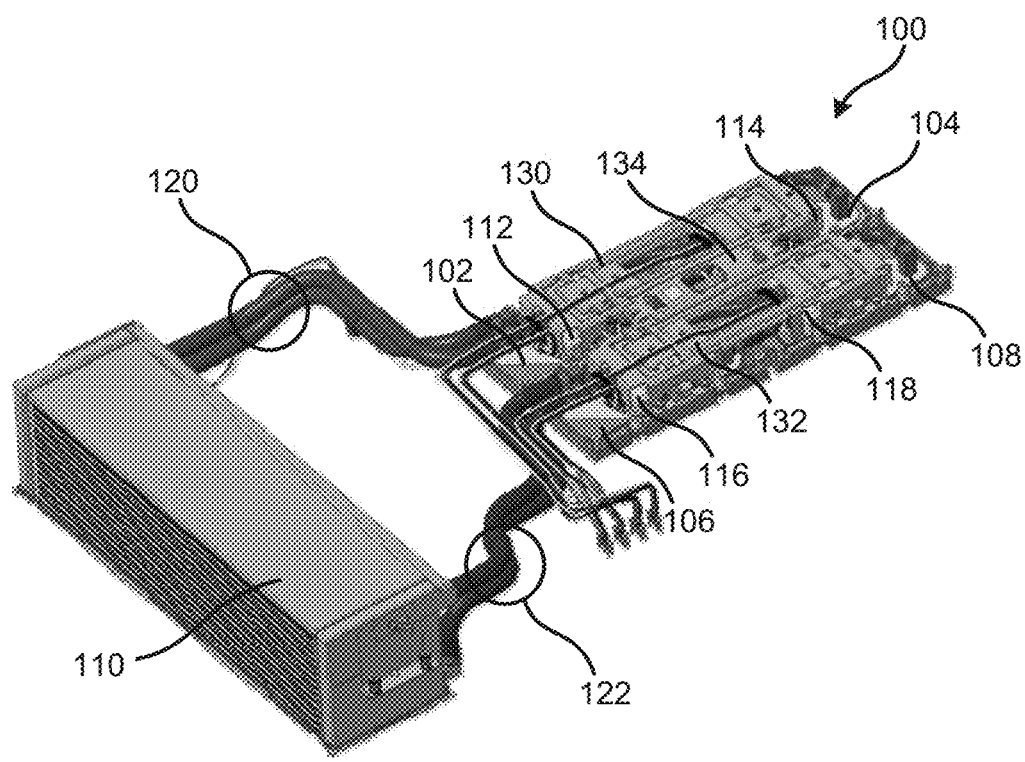
FIGS. 1 and 2 are perspective views of a liquid cooling system in an information handling system according to at least one embodiment of the present disclosure.
Figure 2:
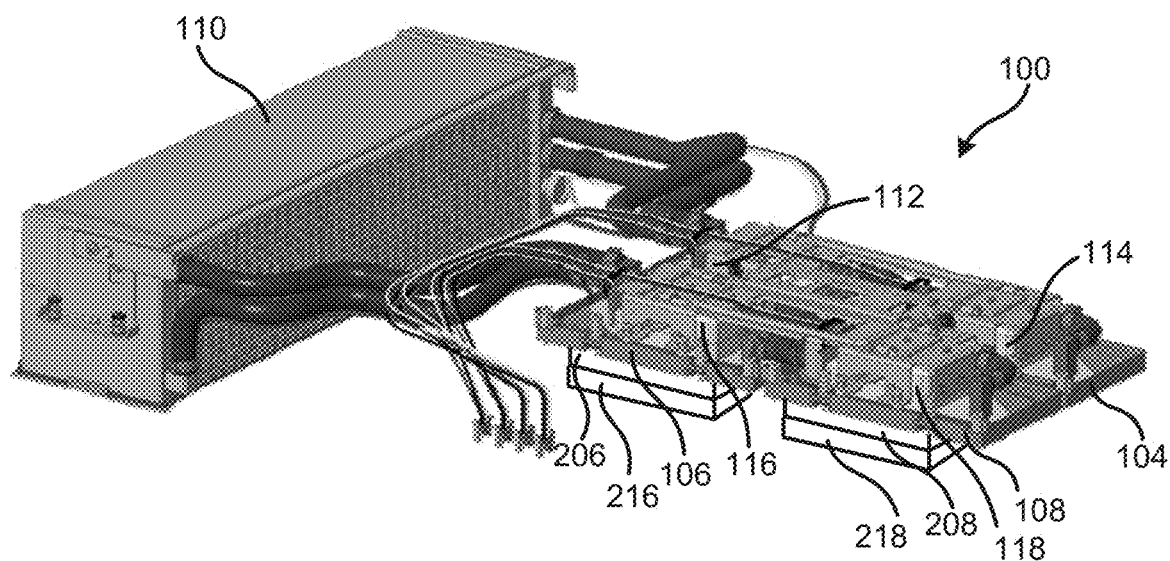

FIGS. 1 and 2 illustrate a liquid cooling system for an information handling system, such as information handling system 1300 of FIG. 13, according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), blade server or rack server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Liquid cooling system 100 includes cold plates 102, 104, 106, and 108, and a radiator 110. Each of cold plates 102, 104, 106, and 108 includes a different pump. For example, cold plate 102 includes a pump 112, cold plate 104 includes a pump 114, cold plate 106 includes a 116, and cold plate 108 includes a pump 118. Cold plates 102 and 104 are coupled to radiator 110 via a first set of pipes 120, and cold plates 106 and 108 are coupled to the radiator via a second set of pipes 122.

In an example, the first set of pipes 120 includes an inlet pipe to deliver cooling liquid from radiator 110 to cold plates 102 and 104, and an outlet pipe to deliver heated cooling liquid from the cold plates back to the radiator. Radiator 110 may cool the heated cooling liquid and then the process may continue by providing the cooling liquid to cold plates 102 and 104 via the inlet pipe of first set of pipes 120. In an example, second set of pipes 122 includes an inlet pipe to deliver cooling liquid from radiator 110 to cold plates 106 and 108, and an outlet pipe to deliver heated cooling liquid from the cold plates back to the radiator. Radiator 110 may cool the heated cooling liquid and then the process may continue by providing the cooling liquid to cold plates 106 and 108 via the inlet pipe of first set of pipes 122.

Liquid cooling system 100 also includes support brackets 130 and 132, and a connection bracket 134. Support bracket 130 may secure pump 112 to cold plate 102 and pump 114 to cold plate 104. Support bracket 132 may secure pump 116 to cold plate 106 and pump 118 to cold plate 108. Connection bracket 134 may be attached between support brackets 130 and 132 to hold cold plates 102, 104, 106, and 108 in a particular orientation with respect to one another. As will be described below, support bracket 130 may be secured to cold plates 102 and 104, and support bracket 130 may be secured to cold plates 106 and 108. Liquid cooling system 100 may include additional components without varying from the scope of this disclosure.

Referring now to FIG. 2, each cold plate may be in physical communication with a different thermal pad. For example, cold plate 106 may be in physical communication with a thermal pad 206, which in turn may be in physical communication with a graphic processing unit (GPU) 216. Similarly, cold plate 108 may be in physical communication with a thermal pad 208, which in turn may be in physical communication with a GPU 218. In an example, pumps 116 and 118 may circulate the cooling liquid from radiator 110 through cold plates 106 and 108 and then back to the radiator. In this example, the movement of the cooling liquid may transfer heat from GPUs 216 and 218 to the cooling liquid via physical communication of the GPUs with corresponding thermal pads 206 and 208, and with the physical communication of the thermal pads with corresponding cold plates 106 and 108. For clarity and brevity, operations of radiator 110, second set of pipes 122, pumps 116 and 118, and cold plates 106 and 108 to cool GPUs 216 and 218 via heat transfer through thermal pads 206 and 208. One of ordinary skill in the art would recognize that the operations of radiator 110, first set of pipes 120, pumps 112 and 114, and cold plates 104 and 106 may be substantially similar to cool two GPUs via heat transfer through corresponding thermal pads in physical communication with the cold plates without varying from the scope of this disclosure.

In an example, connection bracket 134 may be removed to separate support brackets 130 and 132. In this example, if the cold plates, thermal pads, or GPUs associated with one of support brackets 130 or 132 needs to be replaced, only those components may be removed while the components associated with the other support bracket remain in place. For example, support bracket 132, cold plates 106 and 108, pumps 116 and 118, and thermal pads 206 and 208 may be removed from physical communication with GPUs 216 and 218 for service, and support bracket 130, cold plates 102 and 104, and pumps 112 and 114 remain in physical communication with associated thermal pads and GPUs.

Figure 3:
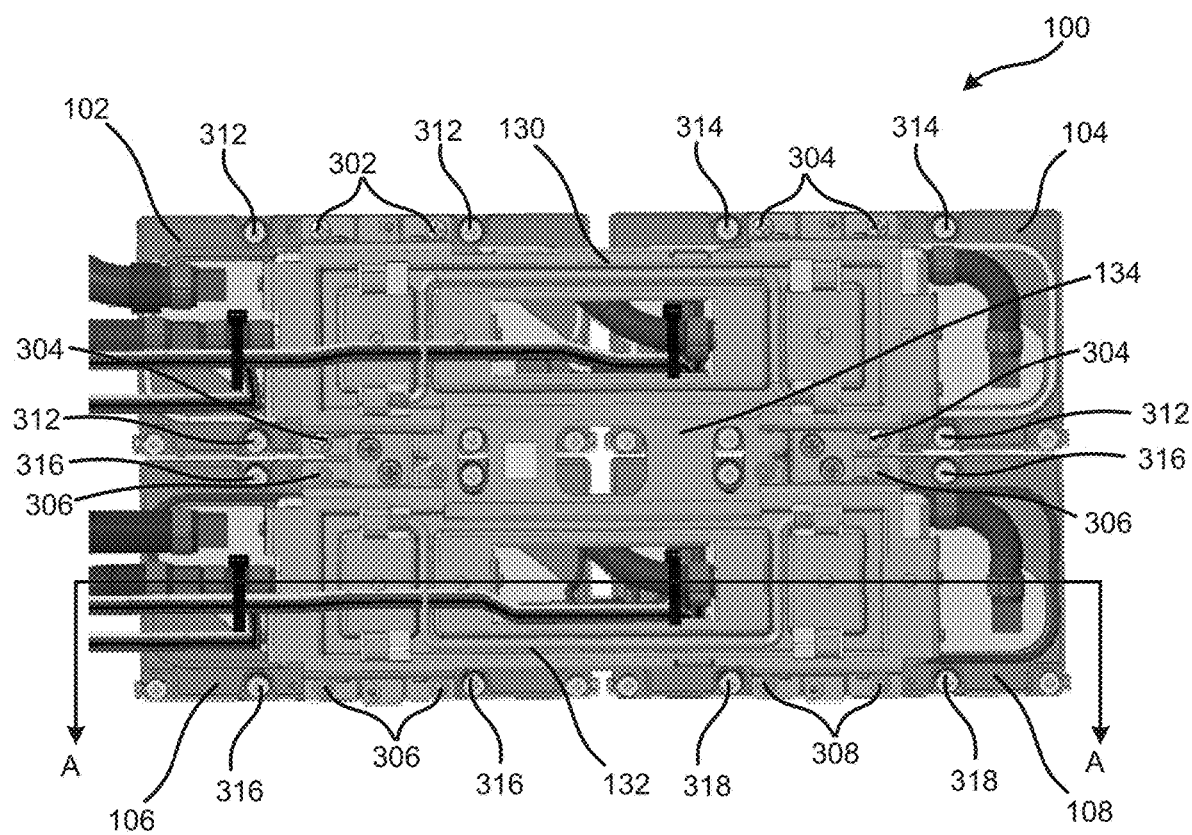
FIG. 3 is a diagram of two support brackets on cold plates according to at least one embodiment of the present disclosure.

FIG. 3 illustrates a portion of liquid cooling system 100 according to at least one embodiment of the present disclosure. Support bracket 130 may be secured to cold plate 102 via multiple mounting screws 302 and may be secured to cold plate 104 via multiple mounting screws 304. Similarly, support bracket 132 may be secured to cold plate 106 via multiple mounting screws 306 and may be secured to cold plate 108 via multiple mounting screws 308. While sets of four screws are illustrated in FIG. 4 for each group of mounting screws 302, 304, 306, and 308, one of ordinary skill in the art would recognize that any suitable number of mounting screws 302, 304, 306, and 308 may be utilized to secured support brackets 302 and 304.

Figure 4:
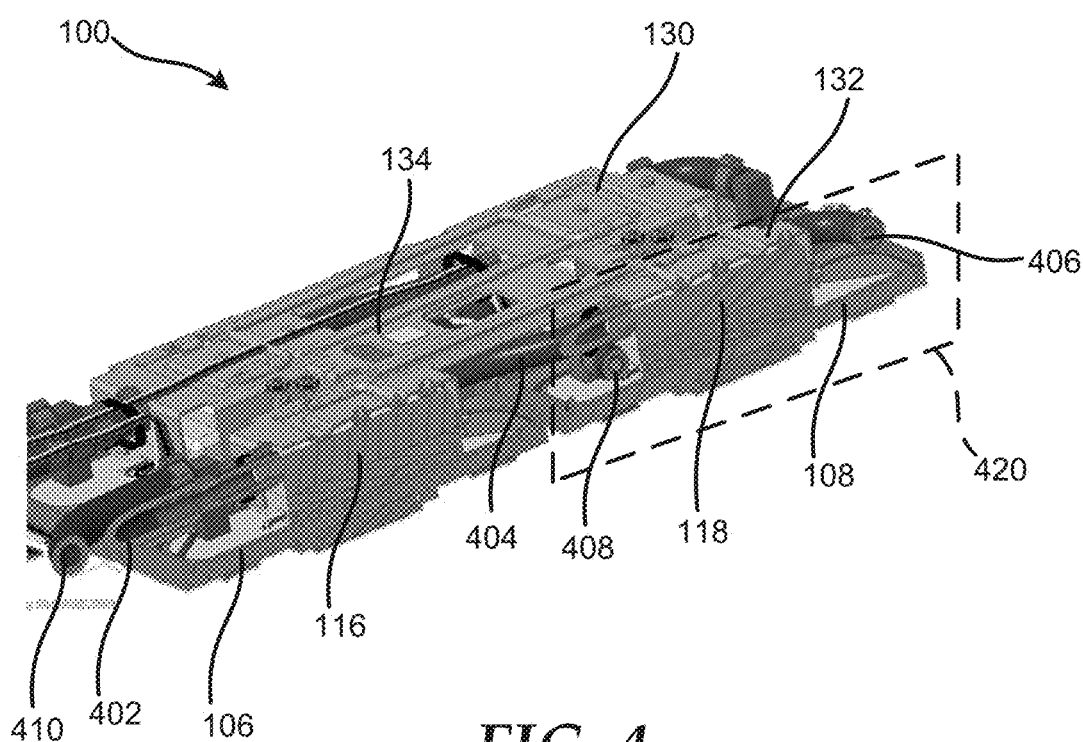
FIG. 4 is a perspective view of a portion of multiple support brackets on cold plate according to at least one embodiment of the present disclosure.

FIG. 4 illustrates a portion of liquid cooling system 100 with a cross section taken along line A-A of FIG. 3 according to at least one embodiment of the present disclosure. Liquid cooling system 100 includes inlet pipes 402, 404 and 406, and outlet pipes 408 and 410. Inlet pipe 402 may connect pump 116 to a radiator, such as radiator 110 of FIGS. 1 and 2. Pump 116 may provide the cooling liquid to pump 118 via inlet pipe 404. Pump 118 may then provide the cooling liquid to cold plate 108 via pipe 406. The cooling liquid may travel through cold plate 108 to remove heat from a GPU and the cooling liquid may be provided to cold plate 106 via outlet pipe 408. The cooling liquid may travel through cold plate 106 to remove heat from a GPU and be provided to radiator 110 via outlet pipe 410. Connection between mounting bracket 132, pump 118, and cold plate 108 within portion 420 will be described with respect to FIG. 5.

Figure 5:
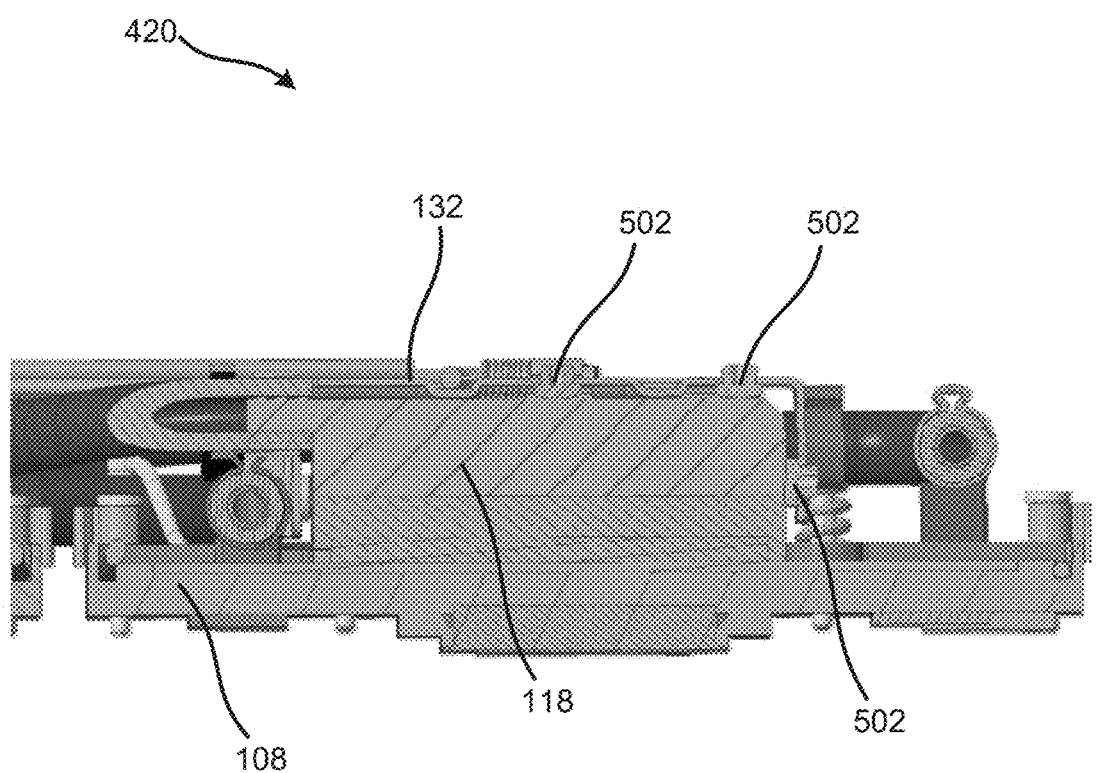
FIG. 5 is a diagram of a portion of a support bracket on cold plates according to at least one embodiment of the present disclosure.

FIG. 5 illustrates a portion 420 of liquid cooling system 100 in FIG. 4 according to at least one embodiment of the present disclosure. Liquid cooling system 100 includes cushion components 502. As illustrated in FIG. 5, cushion components 502 may be mounted within holes of support bracket 132 and placed in physical communication with pump 118. In an example, cushion components 502 may be any suitable compressible material, such as rubber or the like.

In certain examples, cushion components 502 may support pump 118 and prevent vibration forces being transferred from support bracket 132 to pump 118 while mounting screws 308 of FIG. 3 are installed to secure the support bracket to cold plate 108. For clarity and brevity, cushion components 502 have been described with respect to support bracket 132, pump 118, and cold plate 108. One of ordinary skill in the art would recognize that the physical interfaces between mounting bracket 130 and pumps 112 and 114, and the interface between mounting bracket 132 and pump 116 may be substantially similar with corresponding cushion components.

Figure 6:
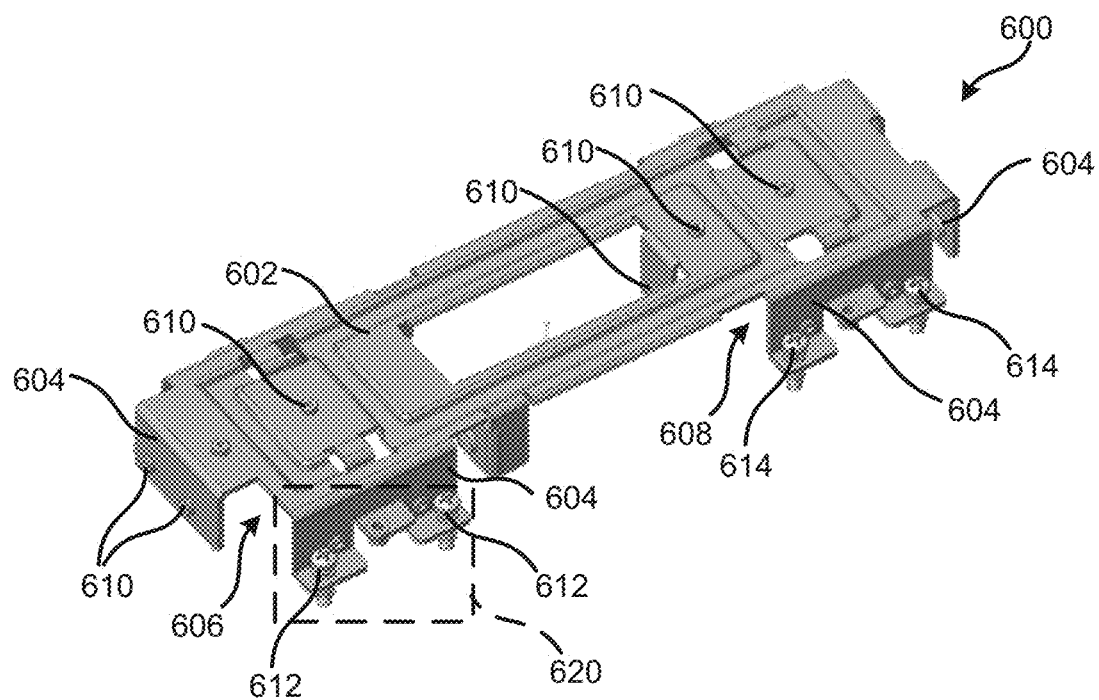
FIG. 6 is a perspective view of a support bracket according to at least one embodiment of the present disclosure.
Figure 7:
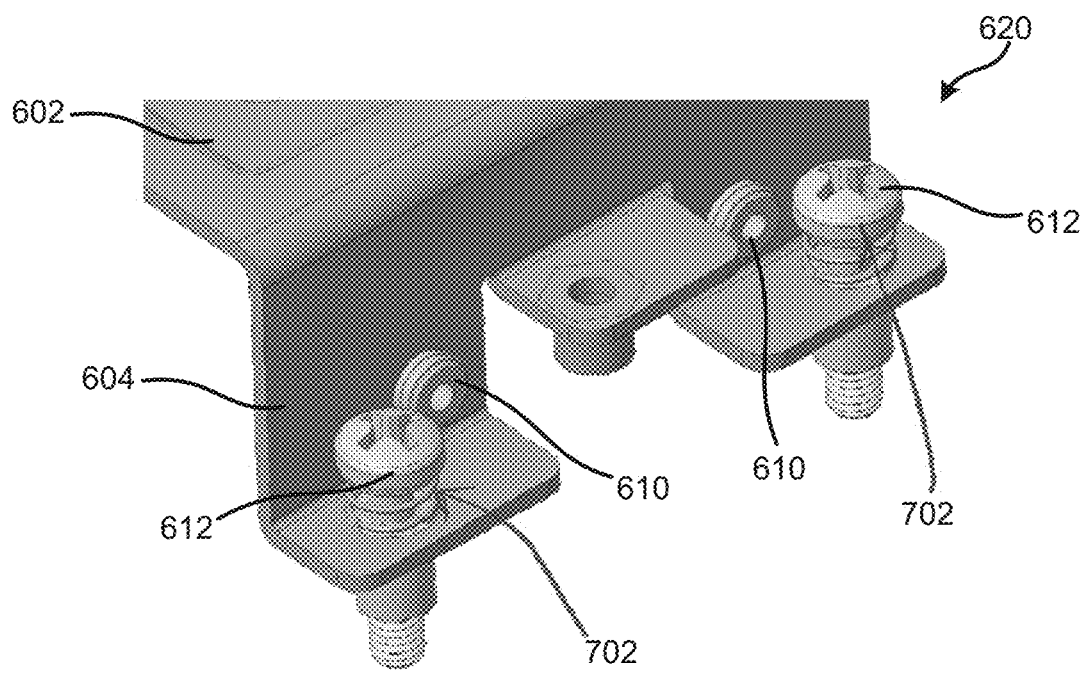
FIG. 7 is a perspective view of a portion of a support bracket according to at least one embodiment of the present disclosure.

FIGS. 6 and 7 illustrate a support bracket 600 according to at least one embodiment of the present disclosure. Support bracket 600 may be substantially similar to support brackets 130 and 132 of FIGS. 1 and 2. Support bracket 600 includes a top surface 602 and multiple edge surfaces 604. In an example, each edge surface 604 may extend in a substantially perpendicular direction away from top surface 602. In certain examples, top surface 602 and a first set of edge surfaces 604 may form a pump holder 606, and top surface 602 and a second set of edge surfaces 604 may form a pump holder 608. Support bracket 600 also includes multiple cushion components 610 and spring floating screws 612 and 614.

In an example, cushion components 610 may be substantially similar to cushion components 502 of FIG. 5. In certain examples, a first set of cushion components 610 may be located within portions of top surface 602 and within edge surfaces 604 that form pump holder 606. The first set of cushion components 610 may be in physical communication with a pump located within pump holder 606. The first set of cushion components 610 may dampen vibration forces being transferred from support bracket 600 to the pump while spring floating screws 612 are installed to secure the support bracket to a cold plate, such as cold plate 106 of FIGS. 1 and 2. In an example, the second set of cushion components 610 may be in physical communication with a pump located within pump holder 608. The second set of cushion components 610 may dampen vibration forces being transferred from support bracket 600 to the pump while spring floating screws 614 are installed to secure the support bracket to a cold plate, such as cold plate 108 of FIGS. 1 and 2.

In an example, the first and second sets of cushion components 610 may also dampen vibration forces generated by the pumps, such as pumps 112 and 114 or pumps 116 and 118, in physical communication with support bracket 600. For example, as a pump within pump holder 606 is operating, the first set of cushion components 610 may dampen the vibration forces generated by the pump before these vibration forces travel to other portions of a liquid cooling system, the GPUs in physical communication with the liquid cooling system, or the like. In certain examples, cushion components 610 may reduce or prevent uneven wear on GPUs in physical communication with the liquid cooling system. A portion of support bracket 600, as outlined by box 620, will be described with respect to FIG. 7.

Referring now to FIG. 7, portion 620 of support bracket 600 illustrates springs 702 within spring floating screws 612. Spring 702 may be located in between a head of spring floating screw 612 and a portion of edge surface 604. In an example, springs 702 of spring floating screws 612 may enable support bracket 600 to independently move up and down at the location of each spring floating screw. In this example, the adjustment of support bracket 600 may enable an even physical communication between the support bracket and the two GPUs coupled to the support bracket.

Figure 8:
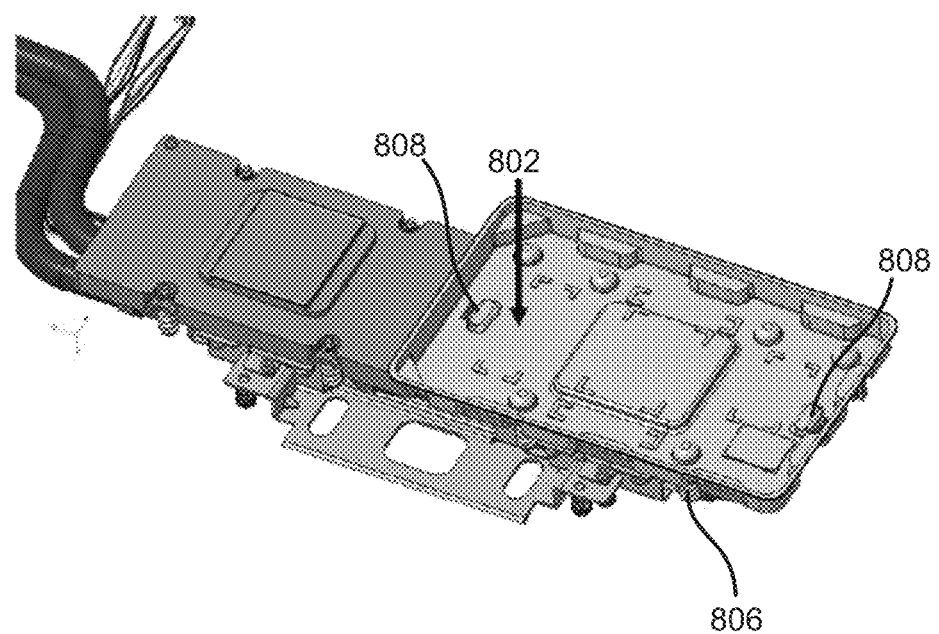
FIG. 8 is a perspective view of a thermal interface mounting bracket on a cold plate according to at least one embodiment of the present disclosure.

FIG. 8 illustrates a thermal interface mounting bracket 802 on a cold plate 804 according to at least one embodiment of the present disclosure. Cold plate 804 may be substantially similar to cold plate 108 of FIGS. 1 and 2. In an example, thermal interface mounting bracket 802 may be securely held in physical communication with cold plate 804 via multiple mounting screws 806. In certain examples, mounting screws 806 may enable thermal interface mounting bracket 802 to have even pressure along the entire surface of cold plate 804. Thermal interface mounting bracket 802 includes hooks 808. In an example, hooks 808 may interface with a thermal interface component as will be described with respect to FIG. 9 below.

Figure 9:
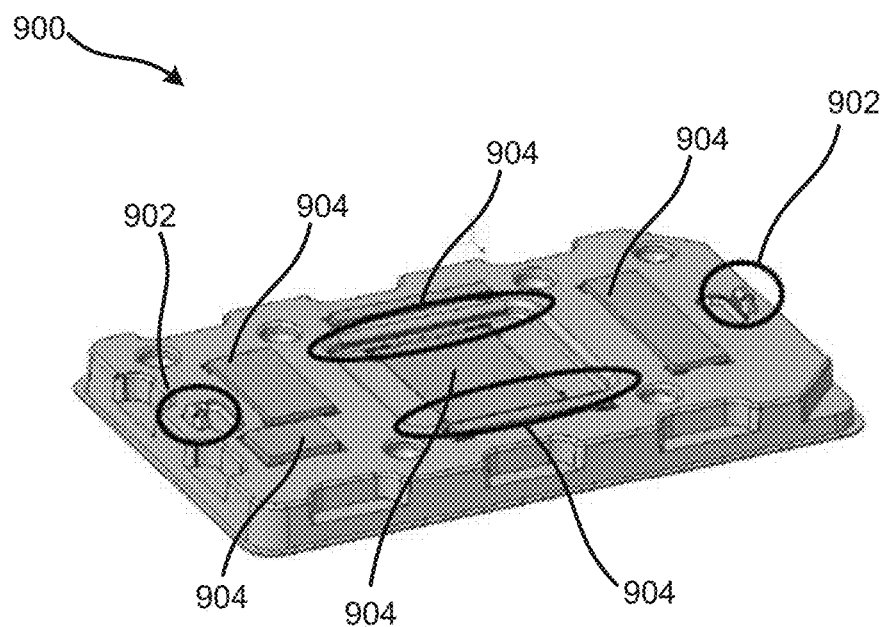
FIG. 9 is a perspective view of a thermal interface component according to at least one embodiment of the present disclosure.

FIG. 9 illustrates a thermal interface component 900 according to at least one embodiment of the present disclosure. Thermal interface component 900 includes mounting hooks 902 and multiple thermal pads 904. In an example, mounting hooks 902 may snap fit with hooks of a thermal interface mounting bracket, such as hooks 808 of thermal interface mounting bracket 802 in FIG. 8. In this example, mounting hooks 902 may enable thermal interface component 900 to be connected and removed from the thermal interface mounting bracket so that the thermal interface component may be removed for service or replacement. In an example, thermal pads 904 may be placed in physical communication with multiple portions of a thermal interface mounting bracket, such as thermal interface mounting bracket 802 of FIG. 8. Based on this physical communication, thermal pads 904 may enable heat transfer from a GPU to a cold plate, such as cold plate 804 of FIG. 8, to provide cooling of the GPU.

Figure 10:
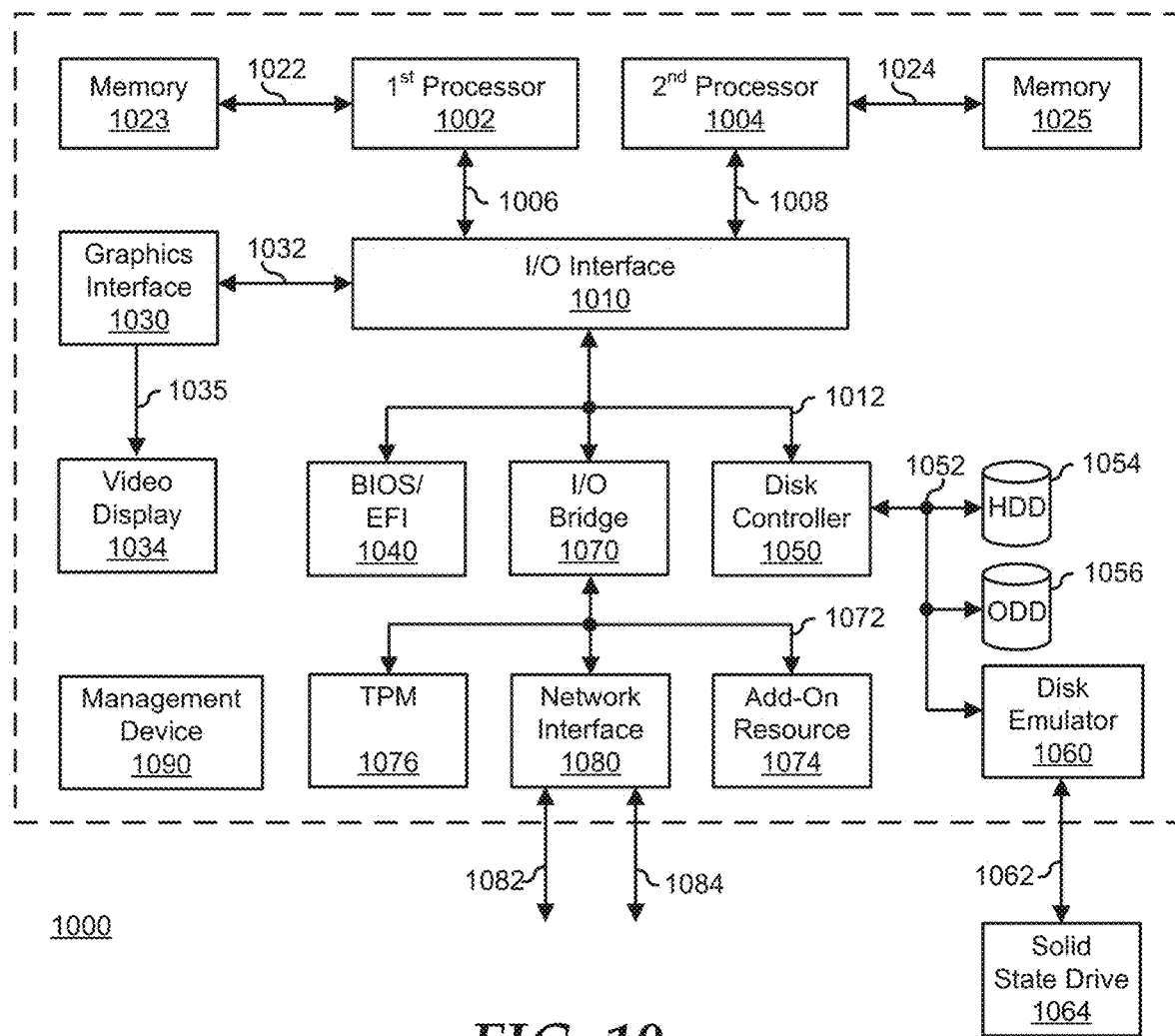
FIG. 10 is a block diagram of a general information handling system according to an embodiment of the present disclosure.

FIG. 10 shows a generalized embodiment of an information handling system 1000 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1000 can include processing resources for executing machine-executable code, such as a central processing unit (CPU), a programmable logic array (PLA), an embedded device such as a System-on-a-Chip (SoC), or other control logic hardware. Information handling system 1000 can also include one or more computer-readable medium for storing machine-executable code, such as software or data. Additional components of information handling system 1000 can include one or more storage devices that can store machine-executable code, one or more communications ports for communicating with external devices, and various input and output (I/O) devices, such as a keyboard, a mouse, and a video display. Information handling system 1000 can also include one or more buses operable to transmit information between the various hardware components.

Information handling system 1000 can include devices or modules that embody one or more of the devices or modules described below and operates to perform one or more of the methods described below. Information handling system 1000 includes a processors 1002 and 1004, an input/output (I/O) interface 1010, memories 1020 and 1025, a graphics interface 1030, a basic input and output system/universal extensible firmware interface (BIOS/UEFI) module 1040, a disk controller 1050, a hard disk drive (HDD) 1054, an optical disk drive (ODD) 1056, a disk emulator 1060 connected to an external solid state drive (SSD) 1062, an I/O bridge 1070, one or more add-on resources 1074, a trusted platform module (TPM) 1076, a network interface 1080, a management device 1090, and a power supply 1095. Processors 1002 and 1004, I/O interface 1010, memory 1020, graphics interface 1030, BIOS/UEFI module 1040, disk controller 1050, HDD 1054, ODD 1056, disk emulator 1060, SSD 1062, I/O bridge 1070, add-on resources 1074, TPM 1076, and network interface 1080 operate together to provide a host environment of information handling system 1000 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1000.

In the host environment, processor 1002 is connected to I/O interface 1010 via processor interface 1006, and processor 1004 is connected to the I/O interface via processor interface 1008. Memory 1020 is connected to processor 1002 via a memory interface 1022. Memory 1025 is connected to processor 1004 via a memory interface 1027. Graphics interface 1030 is connected to I/O interface 1010 via a graphics interface 1032 and provides a video display output 1036 to a video display 1034. In a particular embodiment, information handling system 1000 includes separate memories that are dedicated to each of processors 1002 and 1004 via separate memory interfaces. An example of memories 1020 and 1030 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1040, disk controller 1050, and I/O bridge 1070 are connected to I/O interface 1010 via an I/O channel 1012. An example of I/O channel 1012 includes a Peripheral Component Interconnect (PCI) interface, a PCI-Extended (PCI-X) interface, a high-speed PCI-Express (PCIe) interface, another industry standard or proprietary communication interface, or a thereof. I/O interface 1010 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 1040 includes BIOS/UEFI code operable to detect resources within information handling system 1000, to provide drivers for the resources, initialize the resources, and access the resources. BIOS/UEFI module 1040 includes code that operates to detect resources within information handling system 1000, to provide drivers for the resources, to initialize the resources, and to access the resources.

Disk controller 1050 includes a disk interface 1052 that connects the disk controller to HDD 1054, to ODD 1056, and to disk emulator 1060. An example of disk interface 1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits SSD 1064 to be connected to information handling system 1000 via an external interface 1062. An example of external interface 1062 includes a USB interface, an IEEE 3394 (Firewire) interface, a proprietary interface, or a combination thereof. Alternatively, solid-state drive 1064 can be disposed within information handling system 1000.

I/O bridge 1070 includes a peripheral interface 1072 that connects the I/O bridge to add-on resource 1074, to TPM 1076, and to network interface 1080. Peripheral interface 1072 can be the same type of interface as I/O channel 1012 or can be a different type of interface. As such, I/O bridge 1070 extends the capacity of I/O channel 1012 when peripheral interface 1072 and the I/O channel are of the same type, and the I/O bridge translates information from a format suitable to the I/O channel to a format suitable to the peripheral channel 1072 when they are of a different type. Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within information handling system 1000, a device that is external to the information handling system, or a combination thereof.

Network interface 1080 represents a NIC disposed within information handling system 1000, on a main circuit board of the information handling system, integrated onto another component such as I/O interface 1010, in another suitable location, or a combination thereof. Network interface device 1080 includes network channels 1082 and 1084 that provide interfaces to devices that are external to information handling system 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another information handling system, a data storage system, another network, a grid management system, another suitable resource, or a combination thereof.

Management device 1090 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1000. In particular, management device 1090 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1000, such as system cooling fans and power supplies. Management device 1090 can include a network connection to an external management system, and the management device can communicate with the management system to report status information for information handling system 1000, to receive BIOS/UEFI or system firmware updates, or to perform other task for managing and controlling the operation of information handling system 1000.

Management device 1090 can operate off of a separate power plane from the components of the host environment so that the management device receives power to manage information handling system 1000 when the information handling system is otherwise shut down. An example of management device 1090 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1090 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A liquid cooling system for an information handling system, the liquid cooling system comprising:
   first, second, third, and fourth cold plates;
   first, second, third, and fourth pumps, wherein the first pump is in physical communication with the first cold plate and the second pump is in physical communication with the second cold plate; and
   a first support bracket in physical communication with the first and second cold plates and with the first and second pumps, the first support bracket to secure the first pump to the first cold plate and to secure the second pump to the second cold plate.

2. The liquid cooling system of claim 1, further comprising a second support bracket in physical communication with the third and fourth cold plates and with the third and fourth pumps, the second support bracket to secure the third pump to the third cold plate and to secure the fourth pump to the fourth cold plate.

3. The liquid cooling system of claim 2, further comprising: a connection bracket in physical communication with the first support bracket and with the second support bracket, the connection bracket to hold the first and second support brackets a particular distance apart.

4. The liquid cooling system of claim 1, further comprising a plurality of cushion components, wherein a first set of the cushion components is in physical communication with both the first support bracket and the first pump.

5. The liquid cooling system of claim 4, wherein the first set of the cushion components dampen vibrations transmitted from the first support bracket to the first pump.

6. The liquid cooling system of claim 1, further comprising a plurality of spring floating screws, wherein a first set of the spring floating screws is in physical communication with both the first support bracket and the first cold plate.

7. The liquid cooling system of claim 6, wherein the first set of the spring screws secure the first support bracket to the first cold plate.

8. The liquid cooling system of claim 1, further comprising: a plurality of mounting screws, wherein a first set of the mounting screws secures the first cold plate to a first thermal pad.

9. A liquid cooling system for an information handling system, the liquid cooling system comprising:
   a radiator including a first pair of cooling liquid pipes and a second pair of cooling liquid pipes;
   first and second cold plates coupled to the first pair of cooling liquid pipes, and third and fourth cold plates coupled to the second pair of cooling liquid pipes;
   a first pump in physical communication with the first cold plate and a second pump in physical communication with the second cold plate; and
   a first support bracket in physical communication with the first and second cold plates and with the first and second pumps, the first support bracket to secure the first pump to the first cold plate and to secure the second pump to the second cold plate.

10. The liquid cooling system of claim 9, further comprising a second support bracket in physical communication with the third and fourth cold plates and with third and fourth pumps, the second support bracket to secure the third pump to the third cold plate and to secure the fourth pump to the fourth cold plate.

11. The liquid cooling system of claim 10, further comprising a connection bracket in physical communication with the first support bracket and with the second support bracket, the connection bracket to hold the first and second support brackets a particular distance apart.

12. The liquid cooling system of claim 9, further comprising a plurality of cushion components, wherein a first set of the cushion components is in physical communication with both the first support bracket and the first pump.

13. The liquid cooling system of claim 12, wherein the first set of the cushion components dampen vibrations transmitted from the first support bracket to the first pump.

14. The liquid cooling system of claim 9, further comprising: a plurality of spring floating screws, wherein a first set of the spring floating screws is in physical communication with both the first support bracket and the first cold plate.

15. The liquid cooling system of claim 14, wherein the first set of the spring screws secure the first support bracket to the first cold plate.

16. The liquid cooling system of claim 9, further comprising: a plurality of mounting screws, wherein a first set of the mounting screws secures the first cold plate to a first thermal pad.

17. An information handling system comprising:
   first and second thermal pads;
   a first graphics processing unit in physical communication with the first thermal pad, and a second graphics processing unit in physical communication with the second thermal pad; and
   a liquid cooling system in physical communication with the first and second thermal pads, the liquid cooling system including:
      a first cold plate in physical communication with the first thermal pad, and a second cold plate in physical communication with the second thermal pad;
      a first pump in physical communication with the first cold plate and a second pump in physical communication with the second cold plate; and
      a first support bracket in physical communication with the first and second cold plates and with the first and second pumps, the first support bracket to secure the first pump to the first cold plate and to secure the second pump to the second cold plate.

18. The information handling system of claim 17, further comprising a second support bracket in physical communication with third and fourth cold plates and with third and fourth pumps, the second support bracket to secure the third pump to the third cold plate and to secure the fourth pump to the fourth cold plate.

19. The information handling system of claim 18, further comprising: a radiator including a first pair of cooling liquid pipes and a second pair of cooling liquid pipes, wherein the first and second cold plates are coupled to the first pair of cooling liquid pipes, and the third and fourth cold plates are coupled to the second pair of cooling liquid pipes.

20. The information handling system of claim 17, further comprising a plurality of cushion components, wherein a first set of the cushion components is in physical communication with both the first support bracket and the first pump, wherein the first set of the cushion components dampen vibrations transmitted from the first support bracket to the first pump.

* * * * *